(12) United States Patent
Hwang et al.

(10) Patent No.: US 7,042,760 B2
(45) Date of Patent: May 9, 2006

(54) PHASE-CHANGE MEMORY AND METHOD HAVING RESTORE FUNCTION

(75) Inventors: Young-nam Hwang, Hwaseong-gun (KR); Ki-nam Kim, Anyang (KR); Su-jin Ahn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 201 days.

(21) Appl. No.: 10/788,407

(22) Filed: Mar. 1, 2004

(65) Prior Publication Data

US 2005/0117387 A1 Jun. 2, 2005

(30) Foreign Application Priority Data

Mar. 27, 2003 (KR) ...................... 10-2003-0019257

(51) Int. Cl.
*G11C 11/00* (2006.01)
(52) U.S. Cl. ...................... 365/163; 365/148; 365/113
(58) Field of Classification Search ................ 365/163, 365/148, 113, 100
See application file for complete search history.

(56) References Cited

U.S. PATENT DOCUMENTS

| | | | |
|---|---|---|---|
| 6,075,719 A | 6/2000 | Lowrey et al. | |
| 6,487,113 B1 | 11/2002 | Park et al. | |
| 6,545,907 B1 | 4/2003 | Lowrey et al. | |
| 6,570,784 B1 * | 5/2003 | Lowrey | 365/163 |
| 6,687,153 B1 * | 2/2004 | Lowrey | 365/163 |
| 6,831,856 B1 * | 12/2004 | Pashmakov | 365/163 |
| 6,859,390 B1 * | 2/2005 | Pashmakov | 365/163 |

2003/0002332 A1 1/2003 Lowrey

OTHER PUBLICATIONS

Y.N. Hwang et al., "Completely CMOS-Compatible Phase-Change Nonvolatile RAM Using NMOS Cell Transistors".
Manzur Gill et al., "Ovonic Unified Memory—A High-Performance Nonvolatile Memory Technology for Stand-Alone Memory and Embedded Applications," ISSCC 2002/Session 12/TD: Digital Directions/12.4, pp. 158-159 and 445-446.
Stefan Lai et al., "OUM—A 180 nm Nonvolatile Memory Cell Element Technology For Stand Alone and Embedded Applications," IEDM 01-803-806.
Y.N. Hwang et al., "Phase-Change Chalcogenide Nonvolatile RAM Completely Based on CMOS Technology".
Linda Geppert, "The New Indelible Memories," IEEE Spectrum, Mar. 2003, pp. 49-54.
Jon Malmon et al., "Chalcogenide-Based Non-Volatile Memory Technology," pp. 5-2289-5-2294.

* cited by examiner

*Primary Examiner*—Gene N. Auduong
(74) *Attorney, Agent, or Firm*—Volentine Francos & Whitt, PLLC

(57) ABSTRACT

A phase-change memory device includes a phase-change memory cell having a volume of material which is programmable between amorphous and crystalline states. A write current source selectively applies a first write current pulse to program the phase-change memory cell into the amorphous state and a second write current pulse to program the phase-change memory cell into the crystalline state. The phase-change memory device further includes a restore circuit which selectively applies the first current pulse to the phase-change memory cell to restore at least an amorphous state of the phase-change memory cell.

50 Claims, 8 Drawing Sheets

PHASE-CHANGE MEMORY AND METHOD HAVING RESTORE FUNCTION

BACKGROUND OF THE INVENTION

1. Field of the Invention

The present invention relates to phase-change memory devices, and more particularly, the present invention relates to a phase-change memory and method which include the state restoration of a phase-change cell.

2. Description of the Related Art

Phase change memory cell devices rely on phase change materials, such as chalcogenide, which are capable of stably transitioning between amorphous and crystalline phases. The differing resistance values exhibited by the two phases are used to distinguish logic values of the memory cells. That is, an amorphous state exhibits a relatively high resistance, and a crystalline state exhibits a relatively low resistance.

Reference is made to FIG. 1, which schematically illustrates the phase transition of a phase change cell. The phase change cell is made up of top and bottom electrodes 101 and 102, a resistive heater 103 such as BEC, and a volume of phase change material 104 such as a chalcogenide alloy. The phase of a portion of the phase change material 104 is set by Joule heating of the material according to an amount of current passed through the resistive heater 103 via a transistor 105. To obtain an amorphous state (referred to as a "RESET" state), a relatively high write current pulse ("RESET pulse") is passed through the phase change cell to melt a portion of the material 104 for a short period of time. The current is removed and the cell cools rapidly to below the melting point, which results in the portion of the material 104 having an amorphous phase. The melting point of chalcogenide, for example, is approximately 610° C. To obtain a crystalline state (referred to as a "SET" state), a lower current write pulse ("SET pulse") is applied to the phase change cell for a longer period of time to heat the material 104 to below its melting point. This causes the amorphous portion of the material to re-crystallize to a crystalline phase that is maintained once the current is removed and the cell is rapidly cooled. For example, the re-crystallization temperature of chalcogenide is approximately 450° C.

FIG. 2 illustrates the change in temperature over time of a chalcogenide phase change cell material during the SET and RESET operations. As shown, the material is made amorphous during a rapid cooling (e.g., a few nanosecond) after being heated to above the melting temperature Tm. Crystallization occurs by heating the material below the melting point Tm and above the crystallization temperature Tx for a longer period of time (e.g., 50 nanoseconds or less).

FIG. 3 is a graph showing the V-I characteristics of a phase change memory cell. Again, the example shown illustrates the case of a chalcogenide alloy phase change material. In this example, the SET current region of 1.0 to 1.5 mA is for writing a crystalline state of the memory cell, and the RESET current region of 1.5 to 2.5 mA is for writing an amorphous state of the memory cell. As is apparent from FIG. 3, during a read operation, the differing resistance values of the amorphous and crystalline states can be readily distinguished by application of a low read voltage (e.g., less than 0.5 volts) below a given threshold voltage Vt. The threshold voltage Vt is the voltage above which the current of the cell material becomes the same for both the amorphous and crystalline states.

In a conventional phase-change random access memory (PRAM), the phase change cell operates as a non-volatile memory. That is, sufficiently high write currents are applied to maintain the amorphous and crystalline states of the phase-change material.

In the conventional amorphous write operation (i.e., the RESET operation), the phase change process of the phase change material is characterized by sequential nucleus formation and growth steps. The growth steps result in a large ratio between the RESET resistance and the SET resistance. For example, the RESET resistance may be several tens to hundreds times larger than the SET resistance. This advantageously provides a relatively large sensing margin and data retention time. Unfortunately, however, a high write current is needed to achieve both nucleus formation and growth, and the overall power consumption is large.

It would therefore be desirable to provide a phase-change memory device, such as a PRAM, which exhibits reduced power consumption.

SUMMARY OF THE INVENTION

According to one aspect of the present invention, a phase-change memory device which includes a phase-change memory cell including a volume of material which is programmable between amorphous and crystalline states, and a write current source which selectively applies a first write current pulse to program the phase-change memory cell into the amorphous state and a second write current pulse to program the phase-change memory cell into the crystalline state. The phase-change memory device further includes a restore circuit which selectively applies the first write current pulse to the phase-change memory cell to restore an amorphous state of the phase-change memory cell.

According to another aspect of the present invention, a phase-change memory device is provided which includes a phase-change memory cell including a volume of material which is programmable between amorphous and crystalline states. The phase-change memory device also includes a write current source which operates in a low-power mode to selectively apply a first write current pulse to program the phase-change memory cell into the amorphous state and a second write current pulse to program the phase-change memory cell into the crystalline state, and which operates in a high-power mode to selectively apply a third write current pulse to program the phase-change memory cell into the amorphous state and a fourth write current pulse to program the phase-change memory cell into the crystalline state. The phase-change memory device further includes a restore circuit which is operative in the low-power mode to selectively apply the first current pulse to the phase-change memory cell to restore an amorphous state of the phase-change memory cell.

According to still another aspect of the present invention, a phase-change memory device is provided which is operable in a non-volatile mode and a volatile mode. The phase-change memory device includes a phase-change memory cell including a volume of material which is programmable between amorphous and crystalline states, and a restore circuit which restores at least an amorphous state of the phase-change memory cell in the volatile mode.

According to yet another aspect of the present invention, a phase-change memory device is provided which includes a data line, a plurality of I/O lines, a plurality of bit lines, a plurality of word lines, and a plurality of phase-change memory cells at intersections of the word lines and bit lines, where each of the phase-change memory cells including a volume of material which is programmable between amorphous and crystalline states. The phase-change memory device also includes a write current source which outputs first and second write current pulses to the bit lines according to a voltage of the data line, the first write current pulse for programming the phase-change memory cells into the amorphous state and the second write current pulse for programming the phase-change memory cell into the crystalline state. The phase-change memory device further includes a plurality of sense amplifiers, respectively connected to the bit lines and the I/O lines, which read respective states of the phase-change memory cells, and a restore circuit, connected to the I/O lines and to the data line, which controls the voltage of the data line to restore at least an amorphous state of the phase-change memory cells.

According to another aspect of the present invention, a method of programming a phase-change memory cell is provided which includes selectively applying first and second write current pulses to a phase-change memory cell, the first write current pulse for programming the phase-change memory cells into an amorphous state and the second write current pulse for programming the phase-change memory cell into a crystalline state. The method also includes detecting a state of the phase-change memory cell, and conducting a first restore operation by again applying the first write current pulse to the phase-change memory cell when the phase-change memory cell is detected as the amorphous state.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF THE PREFERRED EMBODIMENTS

The present invention will now be described in detail below with reference to several preferred but non-limiting embodiments.

As discussed previously, the conventional phase-change memory is a non-volatile device, and the phase change transition to the amorphous state includes sequential nucleus formation and growth steps. In contrast, the present invention is at least partially characterized by operating in a volatile memory mode (or a low-power mode) in which the transition to the amorphous state includes nucleus formation only. Further, in the volatile mode, both amorphous write and the crystalline write take place a much lower write currents than the conventional device. Power consumption is substantially reduced. Also, while the resultant resistance ratio between the amorphous and crystalline states is reduced, it is still sufficient to read data.

As examples only, TABLE 1 below shows the write currents for the volatile and non-volatile modes of the present invention in the case of a chalcogenide phase change cell material.

TABLE 1

| Mode | Phase | Write Current | Pulse Width |
|---|---|---|---|
| Non-volatile | Amorphous | 2 mA | 20 ns |
| Non-volatile | Crystalline | 1.2 mA | 50 ns |
| Volatile | Amorphous | <0.5 mA | 20 ns |
| Volatile | Crystalline | <0.3 mA | 50 ns |

As shown in example of TABLE 1, the write current amperages in the volatile mode are substantially less than those in the non-volatile mode. Further, in both modes, the amorphous (RESET) write current pulse has an amperage which is greater than that of the crystalline (SET) write current pulse, and the amorphous write current pulse has a pulse width which is less than that of the crystalline write current pulse.

In the volatile mode, however, it is not necessary for the amperage of the RESET write pulse to exceed that of the SET pulse. For example, the RESET pulse and SET pulse can have the same amperage, but different pulse widths and/or different quenching times.

It should also be noted that the phrase "amorphous state" as used herein has a relative connotation meaning either that more of the material is amorphous than in the crystalline state, or that the material is amorphous to a higher degree than in the crystalline state. In either case, it is not necessary for the material or a portion of the material to be mostly or predominately amorphous, particularly in the context of the volatile mode. Rather, the low write currents in the volatile mode need only to be capable of altering the crystalline structure to create a sufficient resistance ratio between the amorphous and crystalline states.

Since only nucleus formation is carried out in the amorphous write process, the data retention is shortened. However, according to the present invention, the short data retention time is compensated for by periodically restoring at least the amorphous states of the phase-change cells.

Figure 1:
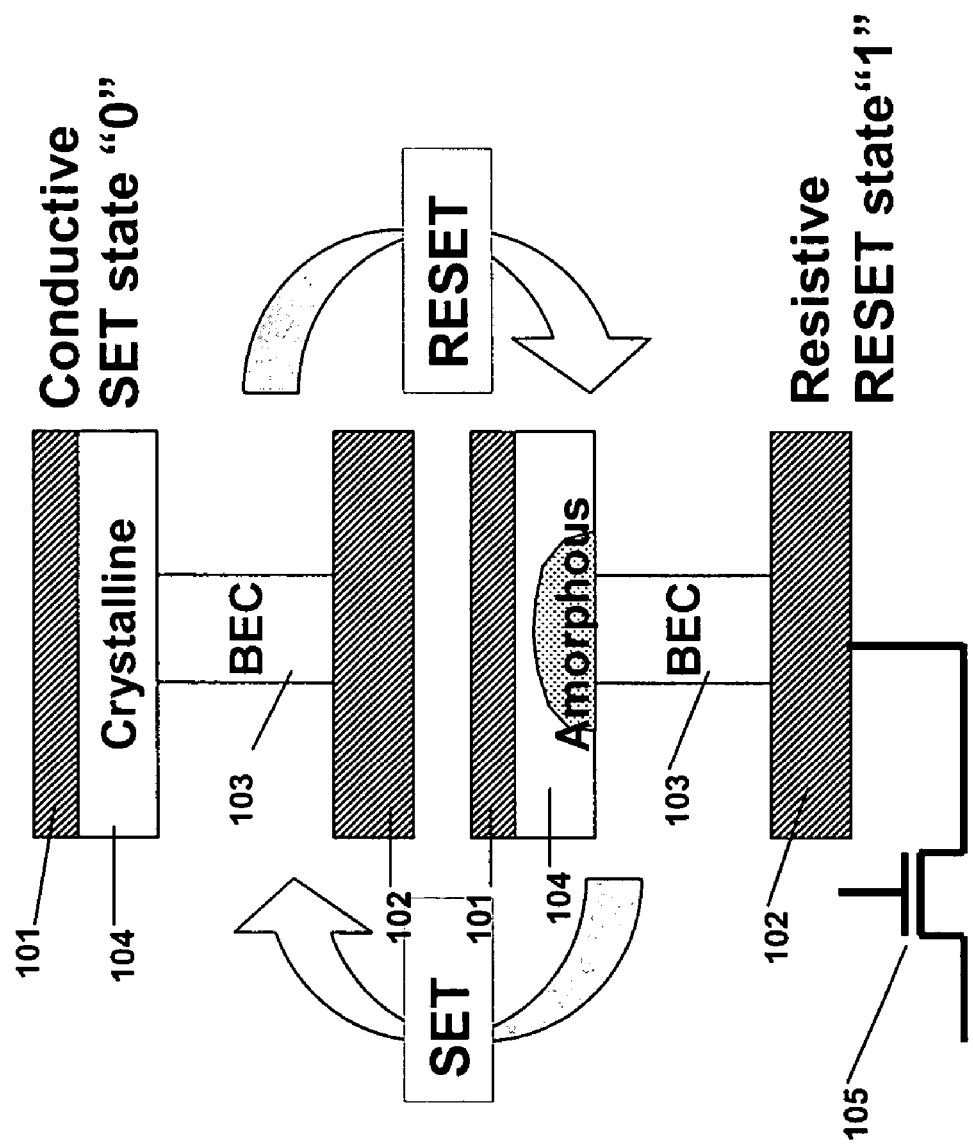
FIG. 1 is a schematic diagram of a phase-change memory cell for explaining the transition between SET and RESET states.
Figure 2:
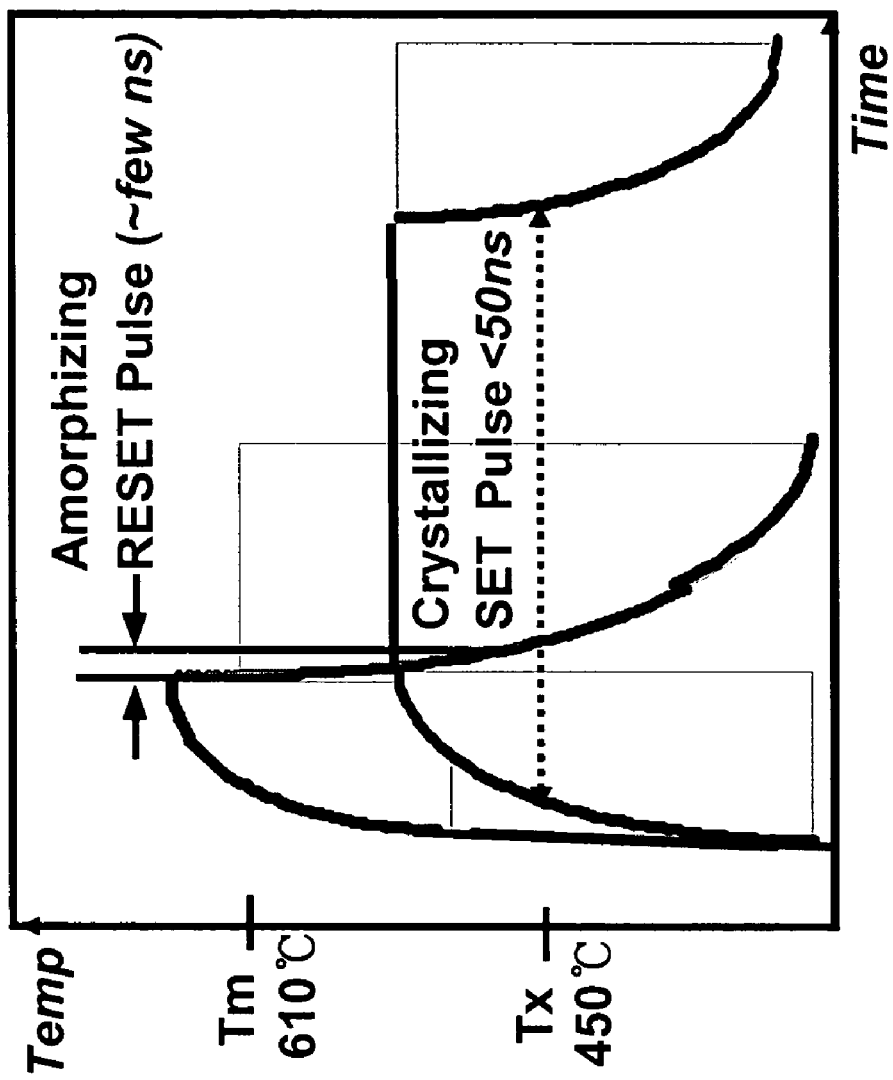
FIG. 2 illustrates the change in temperature over time of a chalcogenide phase change cell material during SET and RESET operations.
Figure 3:
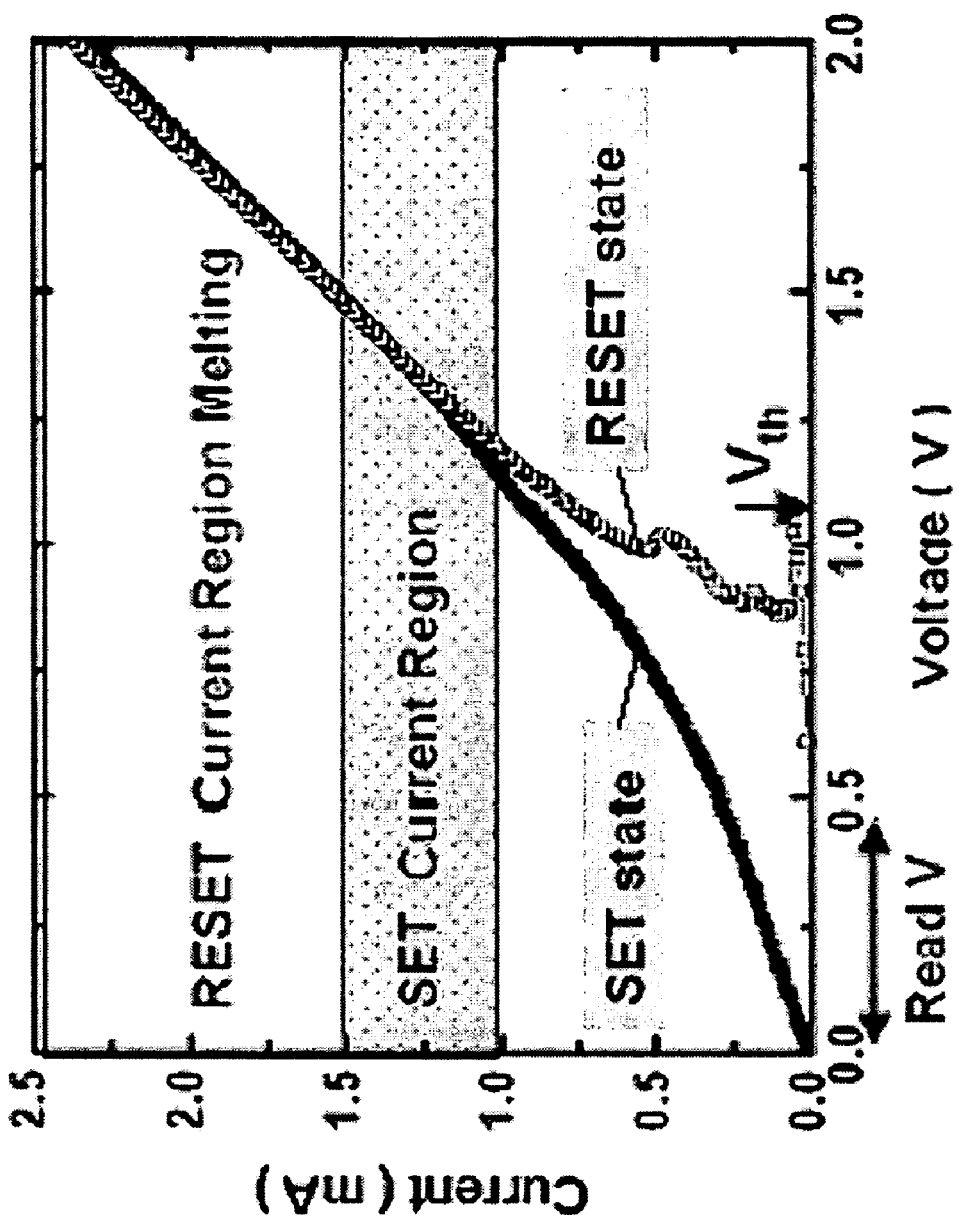
FIG. 3 is a graph showing the V-I characteristics of a phase change memory cell.
Figure 4:
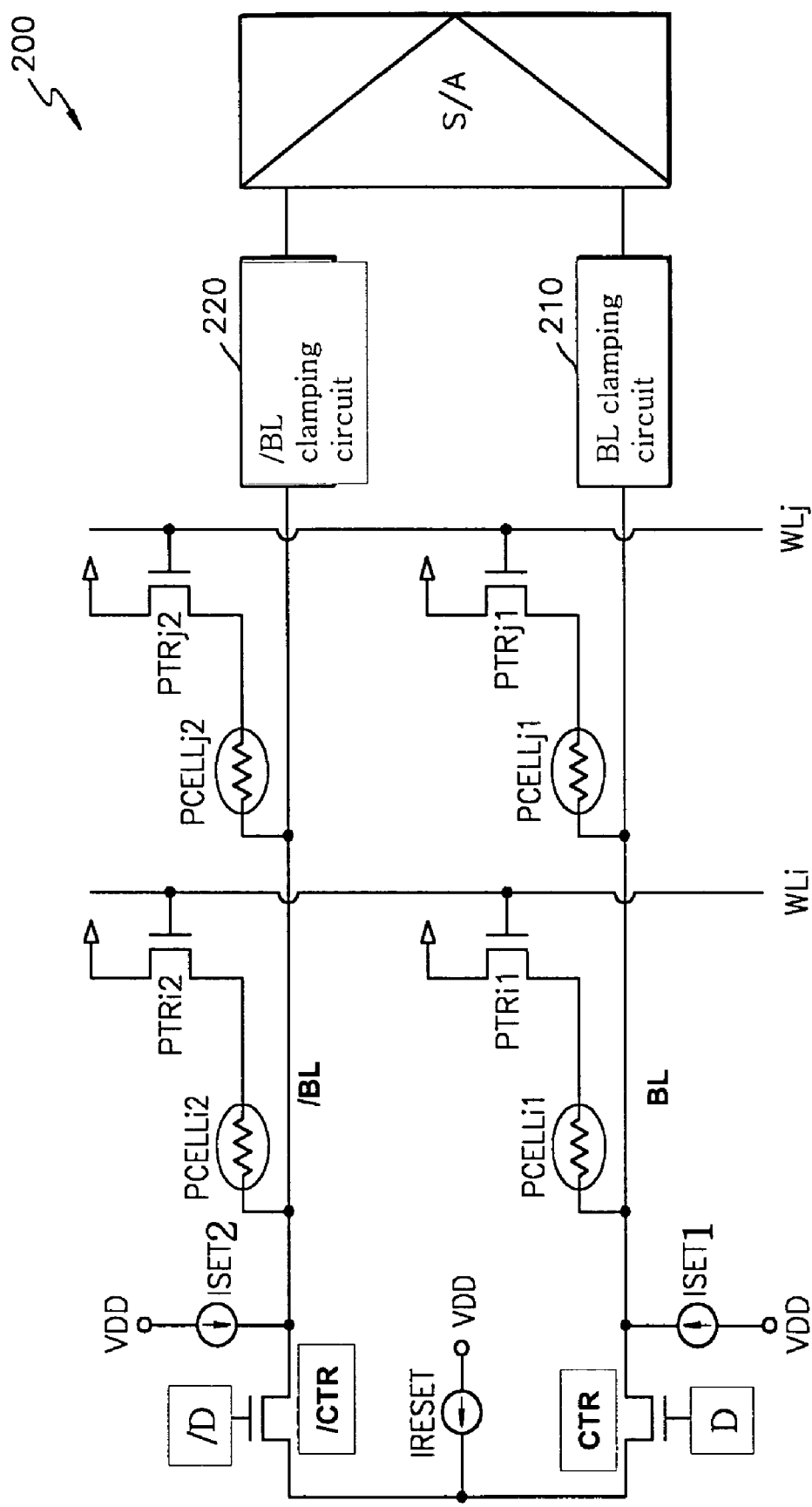
FIG. 4 is a circuit diagram of a twin cell circuit scheme which may be adopted in the phase-change memory device of an embodiment of the present invention.

FIG. 4 is a circuit diagram of a twin cell circuit scheme which may be adopted in the phase-change memory device of an embodiment of the present invention. In this configuration, one bit is physically realized by a combination of two cells written to have opposite logic states, i.e., a low resistance crystalline state and a high resistance amorphous state. The use of two cells per bit enlarges the device operation window and prevents failures caused by resistance distribution.

In FIG. 4, one bit is stored in phase-change cells PCELLi1 and PCELLi2, and another bit is stored in phase-change cells PCELLj1 and PCELLj2. The phase-change cell PCELLi1 and a transistor PTRi1 are connected in series between a reference voltage (e.g., ground) and a bit line BL, and the phase-change cell PCELLi2 and a transistor PTRi2 are connected in series between the reference voltage and an inverted bit line /BL. Likewise, the phase-change cell PCELLj1 and a transistor PTRj1 are connected in series between the reference voltage and the bit line BL, and the phase-change cell PCELLj2 and a transistor PTRj2 are connected in series between the reference voltage and the inverted bit line /BL. The gates of transistors PTRi1 and PTRi2 are connected to a word line Wli, and the gates of transistors PTRj1 and PTRj2 are connected to another word line Wlj.

A current source ISET1 and a current source ISET2 supply respective SET current pulses to the bit lines BL and /BL. Control transistors CTR and /CTR are serially connected to one end of the bit lines BL and /BL, respectively, and are supplied with a RESET current pulse from a current source IRESET. Clamping circuits 210 and 220 are connected to the other end of the bit lines BL and /BL, respectively, and a sense amplifier S/A is connected to the clamping circuits 210 and 220.

The write operation of the twin cell circuit of FIG. 4 will now be described. It is assumed here that a logic value of "1" is to be written into the first combination of cells PCELLi1 and PCELLi2. In this case, word line Wli is set to HIGH, and data signals D and /D are HIGH and LOW, respectively. As such, transistors PTRi1, PTRi2, and CTR are all turned ON, while transistor /CTR is OFF.

Since transistor /CTR is OFF, only the SET current pulse ISET2 is passed through the PCELLi2 and the transistor PTRi2. The SET current pulse ISET2 places the PCELLi2 into a SET (crystalline) state. The SET state is a low resistive state which may be considered to have a logic value "0".

On the other hand, since the transistor CTR is ON, the RESET current pulse IRESET is additionally passed through the PCELLi1 and transistor PTRi1. Although not shown in FIG. 4, the current pulse ISET1 is controlled by and synchronized with the RESET current pulse IRESET, such that a pulse width and timing of ISET1 is the same as those of IRESET. IRESET and ISET1 are therefore combined to place the phase-change cell to place the PCELLi1 into a RESET (amorphous) state. The RESET state is a high resistive state which may be considered to have a logic value "1".

In a read operation, the clamping circuits 210 and 220 limit a voltage on the bit lines BL and /BL to less than the threshold voltage to minimize any perturbation during reading. In this state, assuming again that WLi is HIGH, the low resistance of the PCELLi2 will cause the current on the bit line /BL to be low, while the high resistance of the PCELLi1 will cause the current on the bit line BL to be high. These currents of the respective bit lines BL and /BL are compared at the sense amplifier S/A to discriminate the logic value of the first combination of phase-change cells PCELLi1 and PCELLi2.

Figure 5:
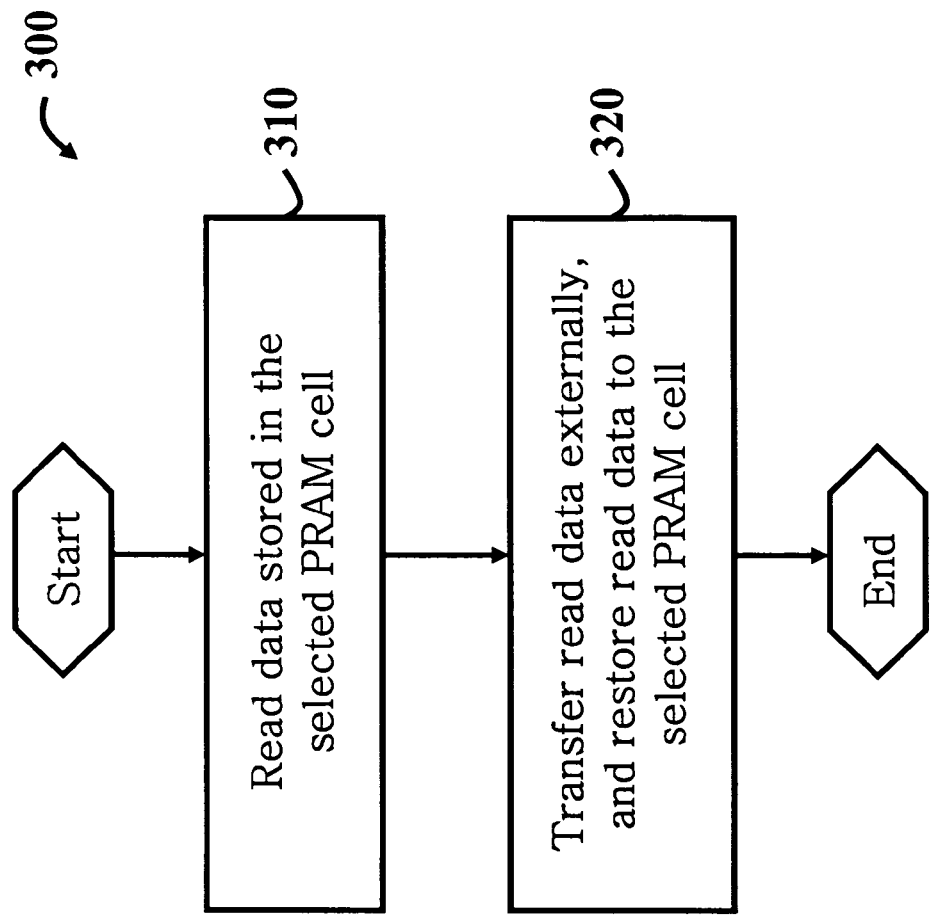
FIG. 5 is a flow chart of a volatile memory mode according to an embodiment of the present invention.

FIG. 5 is a flow chart for explaining a volatile mode of operation of a phase-change memory according to an embodiment of the present invention. In a first step 310, the data stored in the phase-change (PRAM) cell is read. For example, in the configuration of FIG. 4, the currents of the respective bit lines BL and /BL are compared at the sense amplifier S/A to discriminate the logic value of the phase-change cells PCELLi1 and PCELLi2. Then, in a second step 320, the read data is transferred externally and used to restore the state of the read PRAM cell. For example, in the configuration of FIG. 4, the read data is applied as the data signals D and /D to rewrite the same data in the previously read cells PCELLi1 and PCELLi2.

The restoration of the state of the read phase-change cell can occur upon each reading of the phase-change cell. Alternately, the restoration can occur at each of regular intervals, for example, intervals of one hour or more.

Figure 6:
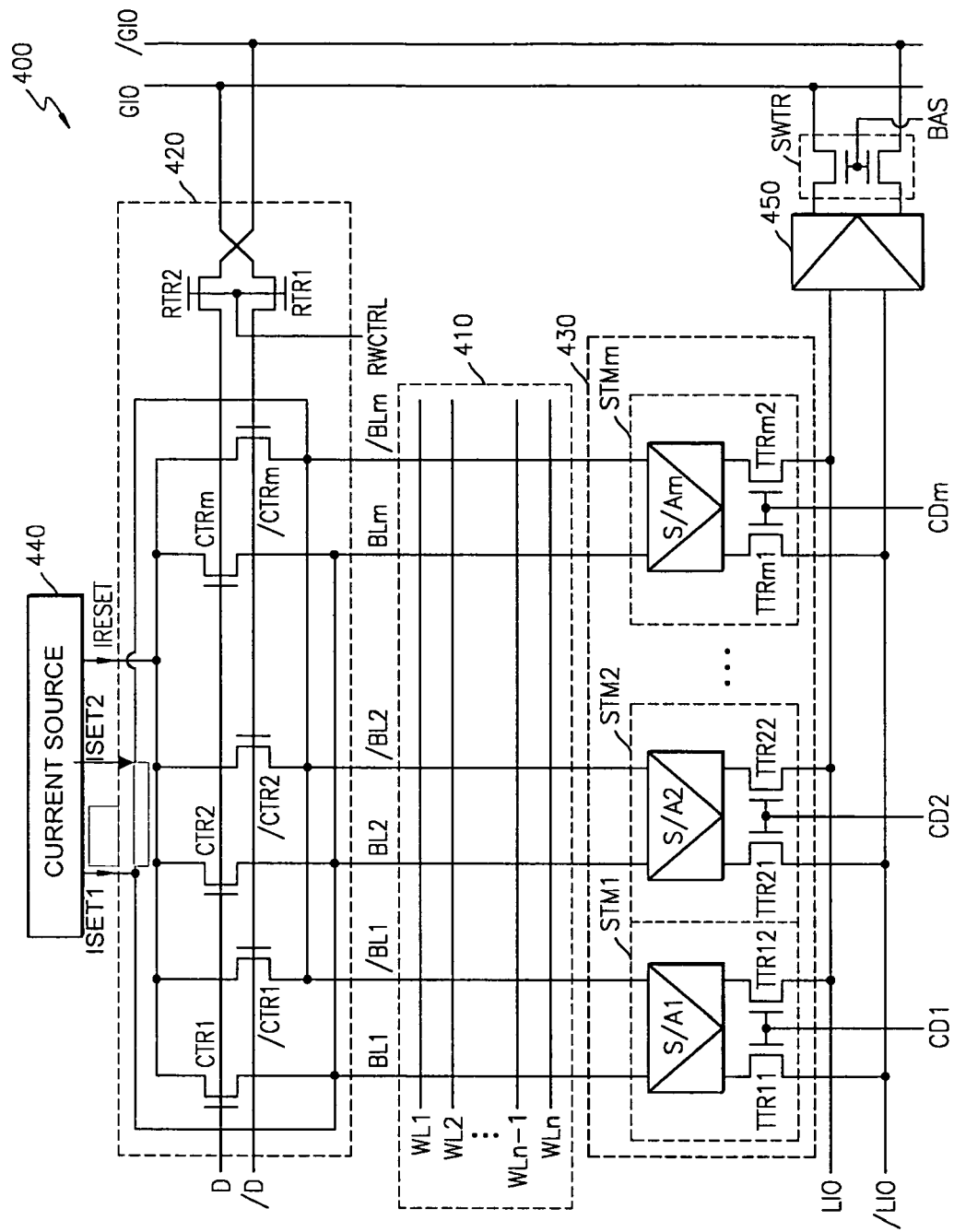
FIG. 6 is a circuit diagram of a phase-change memory device of an embodiment of the present invention.

FIG. 6 illustrates a phase-change memory device according to an embodiment of the present invention. As shown, the phase-change memory device includes a current source 440, a data circuit 420, bit line pairs BL1, /BL1 . . . BLm, BLm, a phase-change memory array block 410, a read circuit 430, local I/O lines LIO and /LIO, an I/O sense amplifier 450, a transfer switch SWTR, and global I/O lines GIO and /GIO.

The data circuit 420 includes a plurality of transistor pairs CTR1, /CTR1 . . . CTRm, /CTRm. Each of the transistors CTR1 . . . CTRm is connected in series between a IRESET current output of the current source 440 and the bit lines BL1 . . . BLm, and each of the transistors /CTR1 . . . /CTRm is connected in series between the IRESET current output of the current source 440 and the bit lines /BL1 . . . /BLm. The data circuit 420 also includes transistors RTR1 and RTR2 having gates commonly connected to a read-write control signal RWCTRL. Transistor RTR1 is connected between data line /D and global I/O line GIO, and transistor RTR1 is connected between data line D and global I/O line /GIO.

The phase change memory array block 410 includes a plurality of phase-change memory cell pairs at the intersections of the word lines WL1 . . . WLn and the bit line pairs BL1, /BL1 . . . BLm, /BLm. Each of the memory cells pairs are connected as shown in previously described FIG. 4.

The read circuit 430 includes a plurality of sensing circuits STM1 . . . STMm respectively connected between the bit line pairs BL1, /BL1 . . . BLm, /BLm and the local I/O lines LIO, /LIO. The sensing circuits STM1 . . . STMm include respective sense amplifiers S/A1 . . . S/Am, and respective transistor pairs TTR11, TTR12 . . . TTRm1, TTRm2. The gates of the transistor pairs are commonly connect to respective control signals CD1 . . . CDm. Also, although not shown, the read circuit 430 may include a plurality of clamping circuits connected to the bit lines BL1, /BL1 . . . BLm, /BLm (see FIG. 4).

Finally, the I/O sense amplifier 450 and a transfer switch SWTR are connected in series between the local I/O lines LIO, /LIO and the global I/O lines GIO, /GIO.

The write operation of the phase-change memory device of FIG. 6 will now be described with respect to the bit lines BL1, /BL1. It is assumed here that a logic value of "1" is to be written into phase-change cells of the bit lines BL1, /BL1 of selected word lines among the word line WL1 . . . WLn. In this case, the selected word lines are set to HIGH, and data signals D and /D are HIGH and LOW, respectively. As such, transistors CTR1 is turned ON, while transistor /CTR1 is OFF.

Since transistor /CTR1 is OFF, only the SET current pulse ISET2 is passed through the memory cells of the selected word lines via bit line /BL1. The SET current pulse ISET2 places the memory cells of bit line /BL1 into a SET (crystalline) state. The SET state is a low resistive state which may be considered to have a logic value "0".

On the other hand, since the transistor CTR1 is ON, both the RESET current pulse IRESET and the SET current pulse ISET2 are passed through the selected memory cells of bit line BL1. Although not shown in FIG. 6, the current pulse ISET1 is controlled by and synchronized with the RESET current pulse IRESET, such that a pulse width and timing of ISET1 is the same as those of IRESET. IRESET and ISET1 are therefore combined to place the phase-change cell to place the PCELLi1 into a RESET (amorphous) state. The RESET state is a high resistive state which may be considered to have a logic value "1".

Figure 7:
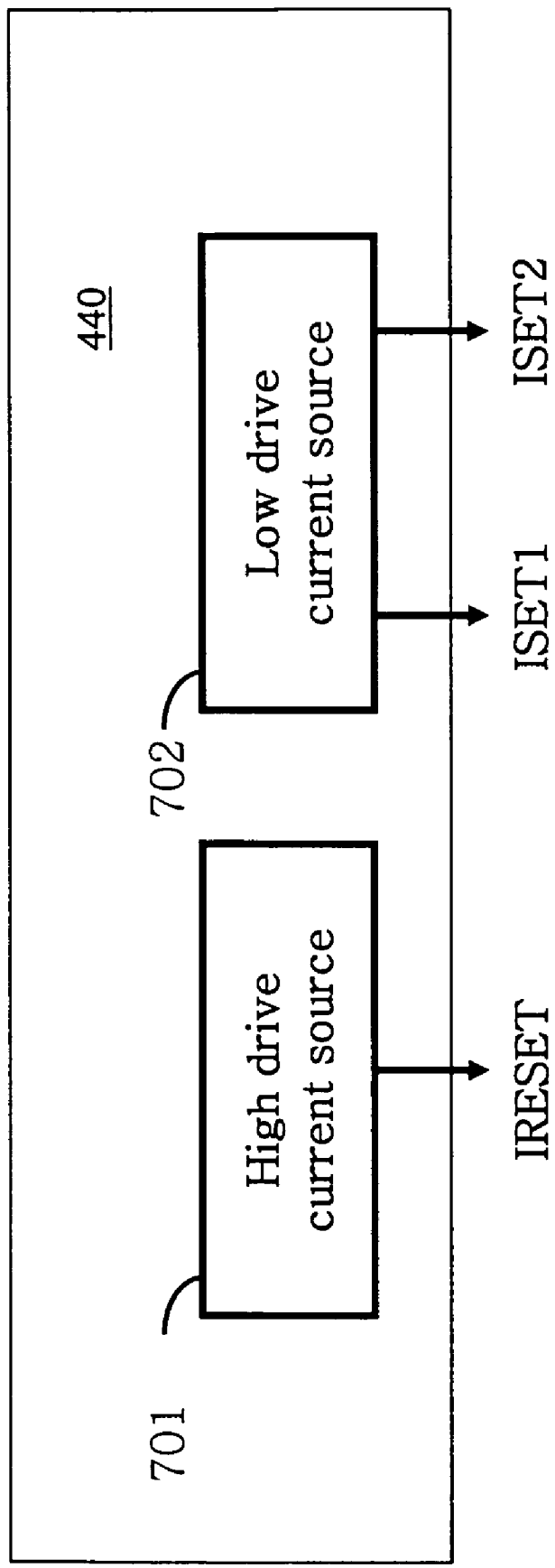
FIG. 7 is a block diagram of a current source of a phase-change memory device of an embodiment of the present invention.

As shown in the block diagram of FIG. 7, the current source 440 may include a high drive current source 701 and a low drive current source 702. The high drive current source 701 outputs IRESET, and the low drive current source 702 outputs ISET1 and ISET2. The values and pulse width of IRESET, ISET1 and ISET2 will depend on whether the circuit is operating in a non-volatile or volatile mode. Also, the values and pulse width of ISET1 and ISET2 further depend on whether an amorphous or crystalline write is being executed. TABLE 2 below shows examples in the case where the memory array block includes chalcogenide phase-change memory cell.

TABLE 2

| Mode | Data | IRESET + ISET1 | IRESET + ISET2 | ISET1 | ISET2 |
|---|---|---|---|---|---|
| Non-volatile | Write "1" | 2 mA, 20 ns | — | — | 1.2 mA, 50 ns |
| Non-volatile | Write "0" | — | 2 mA, 20 ns | 1.2 mA, 50 ns | — |
| Volatile | Write "1" | <0.5 mA, 20 ns | — | — | <0.3 mA, 50 ns |
| Volatile | Write "0" | — | <0.5 mA, 20 ns | <0.3 mA, 50 ns | — |

A read operation of the circuit of FIG. 6 may be carried out in the same manner as discussed above in connection with FIG. 4.

Figure 8A:
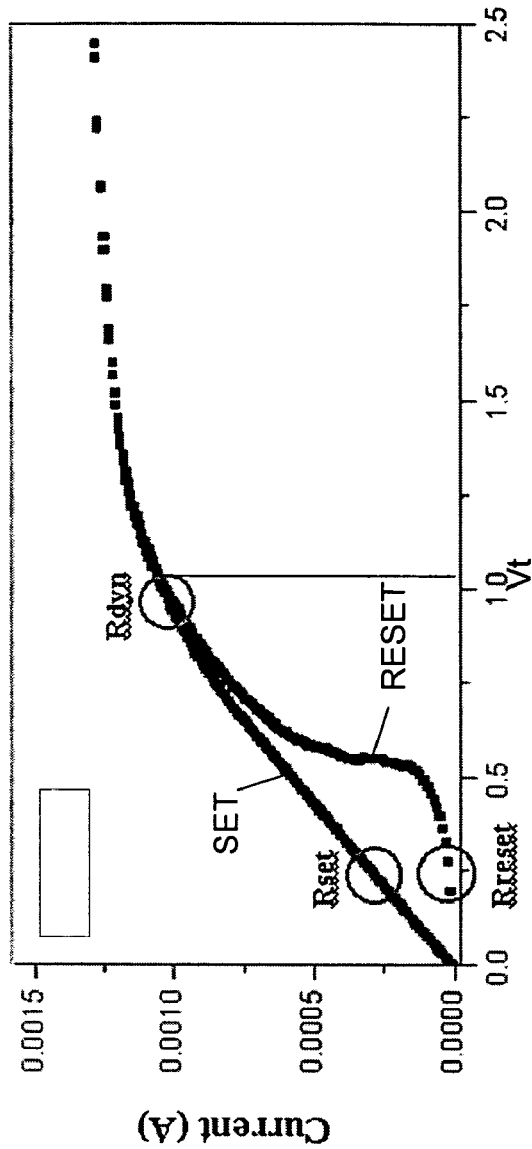
FIGS. 8(A) and 8(B) are graphs showing the V-I characteristics of a phase change memory cell in a non-volatile mode and a volatile mode, respectively, according to an embodiment of the present invention.
Figure 8B:
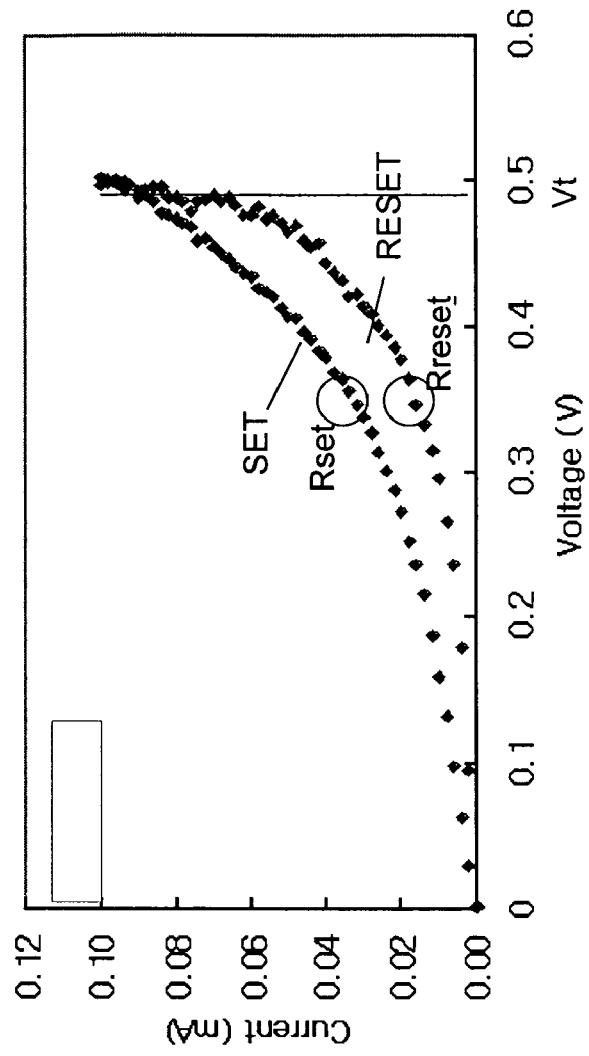

FIG. 8(A) is a graph showing the V-I characteristics of a phase change memory cell in the non-volatile mode, and FIG. 8(B) is a graph showing the V-I characteristics of a phase change memory cell in the volatile mode. Again, the example shown illustrates the case of a chalcogenide alloy phase change material. As shown in FIG. 8(A), the non-volatile mode exhibits a large resistance ratio between Rset and Rreset in the case where a read voltage is less than 0.5 volts. At higher voltages at and above a threshold voltage Vt, the resistance Rdyn of the two states becomes the same. On the other hand, as shown in FIG. 8(B), the threshold voltage Vt of the volatile mode is less than that of the non-volatile mode. Also, the volatile mode exhibits a smaller resistance ratio between Rset and Rreset. Nonetheless, this resistance ratio is still sufficient for sensing purposes, especially when the twin cell scheme such as that shown in FIG. 4 is adopted.

Referring to FIG. 6, data of selected memory cells of bit lines /BL1 . . . /BLm are applied to local I/O line LIO under control of column selection signals CD1 . . . CDm. Also in this example, data of selected memory cells of bit lines BL1 . . . BLm are applied to local I/O line /LIO under control of the column selection signals CD1 . . . CDm. The data is transferred to the global I/O lines GIO and /GIO via the I/O sense amplifier 450 and the transfer switch SWTR under control of a signal BAS.

As discussed previously, the volatile mode of operation is characterized by a relative short retention time of the data stored in the phase-change memory cells, particularly in the amorphous state. Accordingly, the embodiment of FIG. 6 includes circuitry for restoring the stored data in the volatile mode. That is, under control of the RWCTRL signal, the global I/O lines are selectively connected to the data lines D and /D via the transistors RTR1 and RTR2. In this state, the read data appearing on the global lines GIO and /GIO is written into the memory cell array in the same manner as discussed above in connection with normally written data. In the case where the circuit is operating in a non-volatile mode, the RWCTRL signal is LOW, thereby isolating the data lines D and /D from the global I/O lines GIO and /GIO. In the case where the circuit is operating in a volatile mode, the RWCTRL signal is HIGH, thereby connected the data lines D and /D from the global I/O lines GIO and /GIO. In this manner, data is restored in the volatile mode.

It is noted that the data lines D and /D can instead be connected to the local I/O lines LIO and /LIO in the volatile mode.

As noted previously, the restore operation in the volatile mode can be executed upon each read of the data stored in the memory array 410. Alternately, the restore operation can be executed at regular intervals, for example, of one hour or more.

In the drawings and specification, there have been disclosed typical preferred embodiments of this invention and, although specific examples are set forth, they are used in a generic and descriptive sense only and not for purposes of limitation. It should therefore be understood the scope of the present invention is to be construed by the appended claims, and not by the exemplary embodiments.

What is claimed is:

1. A phase-change memory device, comprising:
   a phase-change memory cell including a volume of material which is programmable between amorphous and crystalline states;
   a write current source which selectively applies a first write current pulse to program the phase-change memory cell into the amorphous state and a second write current pulse to program the phase-change memory cell into the crystalline state; and
   a restore circuit which selectively applies the first write current pulse to the phase-change memory cell to restore an amorphous state of the phase-change memory cell.

2. The phase-change memory device as claimed in claim 1, wherein the restore circuit further selectively applies the second write current pulse to the phase-change memory cell to restore a crystalline state of the phase-change memory cell.

3. The phase-change memory device as claimed in claim 1, further comprising a read circuit which reads the programmable state of the phase-change memory cell, wherein the restore circuit is controlled by an output of the read circuit.

4. The phase-change memory device as claimed in claim 3, wherein the restore circuit is operable to apply the first write current pulse to the phase-change memory cell when the output of the read circuit indicates that the phase-change memory cell is in the amorphous state.

5. The phase-change memory device as claimed in claim 4, wherein the output of the read circuit is a global I/O line of the memory device.

6. The phase-change memory device as claimed in claim 4, wherein the output of the read circuit is a local I/O line of the phase-change memory device.

7. The phase-change memory device as claimed in claim 4, wherein the restore circuit further selectively applies the second write current pulse to the phase-change memory cell to restore a crystalline state of the phase-change memory cell.

8. The phase-change memory device as claimed in claim 1, wherein the volume of material is a chalcogenide alloy.

9. The phase-change memory device as claimed in claim 1, wherein the first write current pulse has an amperage which is greater than that of the second write current pulse, and wherein the first write current pulse has a pulse width which is less than that of the second write current pulse.

10. The phase-change memory device as claimed in claim 1, wherein the first write current pulse has an amperage which is the same as that of the second write current pulse, wherein the first write current pulse has a pulse width which is different than that of the second write current pulse, wherein the first write current pulse has a quenching time which is different than that of the second write current pulse.

11. The phase-change memory device as claimed in claim 1, wherein the memory device is switchable between a volatile mode and a non-volatile mode, and wherein the restore circuit is disabled during the non-volatile mode, and wherein the restore circuit is enabled during the volatile mode.

12. A phase-change memory device, comprising:
a phase-change memory cell including a volume of material which is programmable between amorphous and crystalline states;
a write current source which operates in a low-power mode to selectively apply a first write current pulse to program the phase-change memory cell into the amorphous state and a second write current pulse to program the phase-change memory cell into the crystalline state, and which operates in a high-power mode to selectively apply a third write current pulse to program the phase-change memory cell into the amorphous state and a fourth write current pulse to program the phase-change memory cell into the crystalline state; and
a restore circuit which is operative in the low-power mode to selectively apply the first current pulse to the phase-change memory cell to restore an amorphous state of the phase-change memory cell.

13. The phase-change memory device as claimed in claim 12, wherein the restore circuit is further operative in the low-power mode to selectively apply the second write current pulse to the phase-change memory cell to restore a crystalline state of the phase-change memory cell.

14. The phase-change memory device as claimed in claim 12, wherein the low-power mode is a volatile mode of the memory device, and the high-power mode is a non-volatile mode of the memory device.

15. The phase-change memory device as claimed in claim 13, further comprising a read circuit which reads the programmable state of the phase-change memory cell, wherein the restore circuit is controlled by an output of the read circuit.

16. The phase-change memory device as claimed in claim 15, wherein the output of the read circuit is a global I/O line of the memory device.

17. The phase-change memory device as claimed in claim 15, wherein the output of the read circuit is a local I/O line of the phase-change memory device.

18. The phase-change memory device as claimed in claim 15, wherein the restore circuit is operable in the low-power mode to apply the first write current pulse to the phase-change memory cell when the output of the read circuit indicates that the phase-change memory cell is in the amorphous state.

19. The phase-change memory device as claimed in claim 18, wherein the restore circuit is further operative in the low-power mode to apply the second write current pulse to the phase-change memory cell when the output of the read circuit indicates that the phase-change memory cell is in the crystalline state.

20. The phase-change memory device as claimed in claim 12, wherein the volume of material is a chalcogenide alloy.

21. The phase-change memory device as claimed in claim 12, wherein the first write current pulse has an amperage which is greater than that of the second write current pulse, and wherein the first write current pulse has a pulse width which is less than that of the second write current pulse.

22. The phase-change memory device as claimed in claim 12, wherein the first write current pulse has an amperage which is the same as that of the second write current pulse, wherein the first write current pulse has a pulse width which is different than that of the second write current pulse, and wherein the first write current pulse has a quenching time which is different than that of the second write current pulse.

23. The phase-change memory device as claimed in claim 12, wherein an amperage of the third and fourth write current pulses are greater than the amperage of the first and second write current pulses.

24. A phase-change memory device which is operable in a non-volatile memory mode and a volatile memory mode, and which comprises a phase-change memory cell including a volume of material which is programmable between amorphous and crystalline states, and a restore circuit which restores at least an amorphous state of the phase-change memory cell in the volatile memory mode.

25. A phase-change memory device as claimed in claim 24, wherein the restore circuit restores a crystalline state of the memory cell in the volatile memory mode.

26. A phase-change memory device as claimed in claim 24, wherein a state of the phase-change memory cell is not restored during the non-volatile memory mode.

27. A phase-change memory device as claimed in claim 24, wherein, when the volume of material is programmed in the amorphous state, less of the volume is amorphous in the volatile mode than in the non-volatile mode.

28. A phase-change memory device as claimed in claim 24, wherein, when the volume of material is programmed in the amorphous state, a degree to which a portion of the volume is amorphous in the non-volatile mode is greater than a degree to which the same portion of the volume is amorphous in the volatile mode.

29. A phase-change memory device as claimed in claim 24, further comprising a read circuit which reads the state of the phase-change memory cell, wherein the restore circuit is controlled by an output of the read circuit.

30. The phase-change memory device as claimed in claim 29, wherein the restore circuit is operable to restore the amorphous state of the phase-change memory cell when the output of the read circuit indicates that the phase-change memory cell is in the amorphous state.

31. The phase-change memory device as claimed in claim 30, wherein the restore circuit is operable to restore the crystalline state of the phase-change memory cell when the output of the read circuit indicates that the phase-change memory cell is in the crystalline state.

32. The phase-change memory device as claimed in claim 29, wherein the output of the read circuit is a global I/O line of the memory device.

33. The phase-change memory device as claimed in claim 29, wherein the output of the read circuit is a local I/O line of the phase-change memory device.

34. The phase-change memory device as claimed in claim 24, wherein the volume of material is a chalcogenide alloy.

35. A phase-change memory device, comprising:
a data line;
a plurality of I/O lines;
a plurality of bit lines;

a plurality of word lines;

a plurality of phase-change memory cells at intersections of the word lines and bit lines, wherein each of said phase-change memory cells includes a volume of material which is programmable between amorphous and crystalline states;

a write current source which outputs first and second write current pulses to the bit lines according to a voltage of the data line, the first write current pulse for programming the phase-change memory cells into the amorphous state and the second write current pulse for programming the phase-change memory cell into the crystalline state;

a plurality of sense amplifiers, respectively connected to the bit lines and the I/O lines, which read respective states of the phase-change memory cells; and a restore circuit, connected to the I/O lines and to the data line, which controls the voltage of the data line to restore at least an amorphous state of the phase-change memory cells.

36. A phase-change memory device as claimed in claim 35, wherein the restore circuit further controls the voltage of the data line to restore a crystalline state of the phase-change memory cells.

37. The phase-change memory device of claim 35, wherein the memory device is switchable between a volatile mode and a non-volatile mode, and wherein the restore circuit is disabled during the non-volatile mode, and wherein the restore circuit is enabled during the volatile memory mode.

38. The phase-change memory device of claim 37, wherein the write current source outputs the first and second write current pulses to the bit lines in the volatile memory mode, and wherein the write current source further outputs third and fourth write current pulses in the non-volatile mode.

39. The phase-change memory device as claimed in claim 38, wherein the first write current pulse has an amperage which is greater than that of the second write current pulse, and wherein the first write current pulse has a pulse width which is less than that of the second write current pulse.

40. The phase-change memory device as claimed in claim 38, wherein the first write current pulse has an amperage which is the same as that of the second write current pulse, wherein the first write current pulse has a pulse width which is different than that of the second write current pulse, and wherein the first write current pulse has a quenching time which is different than that of the second write current pulse.

41. The phase-change memory device as claimed in claim 38, wherein an amperage of the third and fourth write current pulses are greater than the amperage of the first and second write current pulses.

42. The phase-change memory device as claimed in claim 35, wherein the volume of material of each of the phase-change memory cells is a chalcogenide alloy.

43. A method of programming a phase-change memory cell, the phase-change memory cell including a volume of material which is programmable between amorphous and crystalline states, said method comprising:

selectively applying first and second write current pulses to the phase-change memory cell, the first write current pulse for programming the phase-change memory cell into the amorphous state and the second write current pulse for programming the phase-change memory cell into the crystalline state;

detecting a state of the phase-change memory cell; and conducting a first restore operation by again applying the first write current pulse to the phase-change memory cell when the phase-change memory cell is detected as the amorphous state.

44. The method of claim 43, further comprising conducting a second restore operation by again applying the second write current pulse to the phase-change memory cell when the phase-change memory cell is detected as the crystalline state.

45. The method of claim 43, wherein the detection of the state of the phase-change memory cell occurs at each read operation of the phase-change memory cell, and wherein the first restore operation occurs at each read operation of the phase-change memory cell when the phase-change memory cell is detected as the amorphous state.

46. The method of claim 43, wherein the detection of the state of the phase-change memory cell occurs at each read operation of the phase-change memory cell, and wherein the first or second restore operation occurs at each read operation of the phase-change memory cell.

47. The method of claim 43, wherein the detection of the state of the phase-change memory cell repeatedly occurs at a regular interval, and wherein the first restore operation occurs at each regular interval when the phase-change memory cell is detected as the amorphous state.

48. The method of claim 47, wherein the regular interval is at least 60 minutes.

49. The method of claim 43, wherein the detection of the state of the phase-change memory cell repeatedly occurs at a regular interval, and wherein the first or second restore operation occurs at each regular interval.

50. The method of claim 49, wherein the regular interval is at least 60 minutes.

* * * * *